(12) United States Patent
Dusa et al.

(10) Patent No.: US 7,148,959 B2
(45) Date of Patent: Dec. 12, 2006

(54) TEST PATTERN, INSPECTION METHOD, AND DEVICE MANUFACTURING METHOD

(75) Inventors: Mircea Dusa, Campbell, CA (US); Arie Jeffrey Den Boef, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 388 days.

(21) Appl. No.: 10/696,726

(22) Filed: Oct. 30, 2003

(65) Prior Publication Data

US 2004/0119970 A1   Jun. 24, 2004

(30) Foreign Application Priority Data

Nov. 1, 2002   (EP)   ................... 02257610

(51) Int. Cl.
*G01N 21/88* (2006.01)
(52) U.S. Cl. ............ 356/237.4; 356/400; 430/30
(58) Field of Classification Search .. 356/237.1–237.5, 356/399–401; 430/30, 311; 438/5–18
See application file for complete search history.

(56) References Cited

U.S. PATENT DOCUMENTS

| | | | |
|---|---|---|---|
| 6,458,605 B1 | 10/2002 | Stirton | |
| 2002/0041373 A1 | 4/2002 | Littau et al. | |
| 2002/0072003 A1 | 6/2002 | Brill et al. | |
| 2002/0158193 A1* | 10/2002 | Sezginer et al. | 250/237 G |
| 2004/0129900 A1* | 7/2004 | Den Boef et al. | 250/559.3 |
| 2006/0033921 A1* | 2/2006 | Den Boef et al. | 356/446 |

FOREIGN PATENT DOCUMENTS

| | | | |
|---|---|---|---|
| JP | 2004-287400 | * | 10/2004 |
| WO | WO 02/065545 A2 | | 8/2002 |

OTHER PUBLICATIONS

Niu et al., "Specular Spectroscopic Scatterometry in DUV Lithography," SPIE, SPIE Conference on Metrology, Inspection, and Process Control for Microlithography XIII (Santa Clara, CA), p. 159-168, vol. 3677 (Mar. 1999).
Raymond et al., "Multiparameter Grating Metrology Using Optical Scatterometry," J. Vac. Sci. Technol. B, American Institute of Physics, vol. 15 (No. 2), p. 361-368, (Mar./Apr. 1997).

* cited by examiner

*Primary Examiner*—Hoa Q. Pham
(74) *Attorney, Agent, or Firm*—Pillsbury Winthrop Shaw Pittman, LLP

(57) ABSTRACT

A method according to one embodiment of the invention may be applied to enhance scatterometry measurements made from a two-component test pattern. Reference patterns corresponding to each of the components of the two-component pattern are also printed. Scatterometry signals derived from the reference patterns, corresponding to the separate components of the test pattern, are used to enhance the signal from the test pattern to improve sensitivity and signal-to-noise ratios.

19 Claims, 4 Drawing Sheets

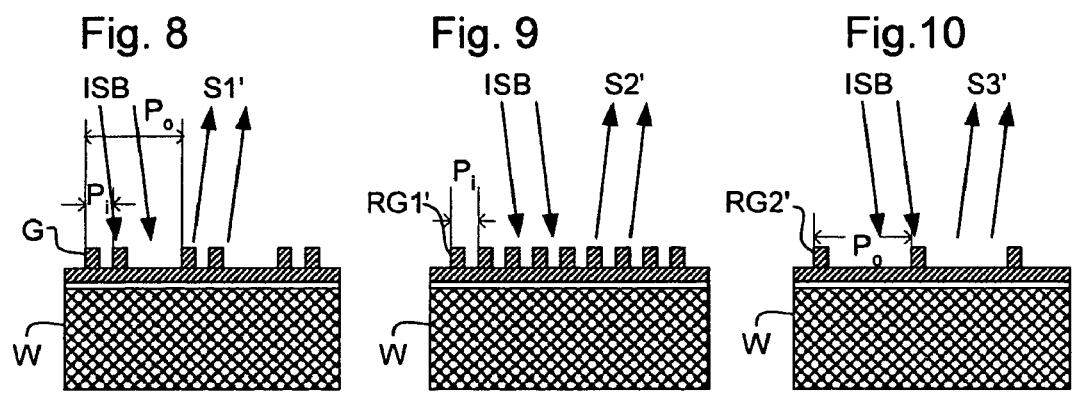

TEST PATTERN, INSPECTION METHOD, AND DEVICE MANUFACTURING METHOD

RELATED APPLICATIONS

This application claims priority to European Patent Application EP 02257610.2, filed Nov. 1, 2002, which document is hereby incorporated by reference.

FIELD OF THE INVENTION

The present invention relates to methods of inspection and manufacture.

BACKGROUND

One application of a lithographic apparatus is to apply a desired pattern onto a target portion of a substrate. Lithographic apparatus can be used, for example, in the manufacture of integrated circuits (ICs). In that circumstance, a patterning structure, such as a mask, may be used to generate a circuit pattern corresponding to an individual layer of the IC, and this pattern can be imaged onto a target portion (e.g. comprising one or more dies and/or portion(s) thereof) on a substrate (e.g. a wafer of silicon or other semiconductor material) that has a layer of radiation-sensitive material (e.g. a coating of resist). In general, a single substrate will contain a network of adjacent target portions that are successively irradiated via the projection system (e.g. one at a time).

Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. A projection beam in a scanning type of apparatus may have the form of a slit with a slit width in the scanning direction. More information with regard to lithographic apparatus as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (e.g. resist). Prior to this imaging procedure, the substrate may undergo various other procedures, such as priming, resist coating, and/or a soft bake. After exposure, the substrate may be subjected to other procedures, such as a post-exposure bake (PEB), development, a hard bake, and/or measurement/inspection of the imaged features. This array of procedures is used as a basis to pattern an individual layer of a device (e.g. an IC). Such a patterned layer may then undergo various processes such as etching, ion-implantation (doping), metallization, oxidation, chemo-mechanical polishing, etc., all of which may be intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

The measurement and inspection procedure following development of the resist, referred to as "in-line" because it is carried out in the normal course of processing production wafers, serves two purposes. Firstly, it is desirable to detect any target areas where the pattern in the developed resist may be faulty. If a sufficient number of dies are faulty, the wafer can be stripped of the patterned resist and re-exposed, hopefully correctly, rather than making the fault permanent by carrying out a process procedure (e.g. an etch) with a faulty pattern. Secondly, the measurements may allow errors in the lithographic apparatus (e.g. in illumination settings or exposure times) to be detected and corrected for subsequent exposures.

However, some types of errors in the lithographic apparatus may not be easily detected or quantified from the patterns printed in exposures. Detection of a fault does not always lead directly to its cause. Thus, a variety of "off-line" procedures for detecting and measuring errors in the lithographic apparatus are known. These procedures may involve replacing the substrate with a measuring device or carrying out exposures of special test patterns, e.g. at a variety of different machine settings. Such off-line techniques take time, often a considerable amount, during which the apparatus cannot be used for production exposures. Therefore, in-line techniques (that is, ones which can be carried out using, or at the same time as, production exposures) for detecting and measuring errors in the lithographic apparatus may be preferred.

To measure dimensional errors, such as overlay and left-right dimensional differences caused by comatic aberration, image-based tools are used at present. Such tools include box-in-box (or frame-inframe) for overlay and scanning electron microscopes (SEM) to measure critical dimensions (CD) for coma. These techniques, as well as being off-line, have the disadvantage that they make localized measurements which do not necessarily accurately reflect the projection system or process behavior over the full die or target area.

One in-line method used in device manufacturing for measurements of linewidth, pitch and critical dimension (CD) makes use of a technique known as "scatterometry". Methods of scatterometry are described in Raymond et al., "Multiparameter Grating Metrology Using Optical Scatterometry", J. Vac. Sci. Tech. B, Vol. 15, no. 2, 361–368 (1997) and Niu et al., "Specular Spectroscopic Scatterometry in DUV Lithography", SPIE, Vol. 3677 (1999). In some methods of scatterometry, white light is reflected by periodic structures in the developed resist, and the resulting reflection spectrum at a given angle is detected. The structure giving rise to the reflection spectrum is reconstructed, e.g. using Rigorous Coupled-Wave Analysis (RCWA) or by comparison to a library of spectra derived by simulation. However, the reconstruction of the structure is computationally very intensive, and the technique can suffer from low sensitivity and poor repeatability.

Other disclosures of the use of scatterometry in lithography include PCT Patent Publication No. WO 02/065545, which proposes to measure overlay by scatterometry measurements from two overlying gratings. This document suggests that if a sample of one of the gratings not overlain by the other is available, measurements may be taken to constrain the measurement of overlay derived from the two overlying gratings. U.S. Pat. No. 6,458,605 and U.S. patent application Ser. No. 2002/0041373 utilize reference libraries derived from measurements of reference structures to aid in derivation of information from scatterometry measurements. U.S. patent application Ser. No. 2002/0041373 also proposes printing a randomly distributed focus-energy matrix (FEM) of identical test gratings on a wafer and derives information from scatterometry measurements thereof, especially from differences between scatterometry measurements from different gratings in the matrix.

SUMMARY an inspection method comprising using a lithographic apparatus to print onto a substrate a test pattern comprising a combination of first and second pattern components, said first pattern component being different from said second pattern component; using a lithographic apparatus to print onto said substrate first and second reference patterns corresponding respectively to said first and second pattern components; using a scatterometer to measure first, second and third reflection spectra of said test pattern and said first and second reference patterns; and deriving from said first, second and third reflection spectra information indicative of a parameter of said test pattern on said substrate.

According to a further aspect of the invention there is provided a device manufacturing method comprising providing a substrate that is at least partially covered by a layer of radiation-sensitive material; providing a projection beam of radiation using a radiation system; using patterning structure to endow the projection beam with a pattern in its cross-section; projecting the patterned beam of radiation onto a target portion of the layer of radiation-sensitive material, wherein said pattern comprises a pattern representing a process layer; a test pattern comprising a combination of first and second pattern components, said first pattern component being different from said second pattern component; and first and second reference patterns corresponding respectively to said first and second pattern components; and by using a scatterometer to measure first, second and third reflection spectra of said test pattern and said first and second reference patterns; and deriving from said first, second and third reflection spectra information indicative of a parameter of said test pattern on said substrate.

BRIEF DESCRIPTION OF THE DRAWINGS

Embodiments of the invention will now be described, by way of example only, with reference to the accompanying schematic drawings in which:

FIGS. 8 to 10 depict a test pattern and first and second reference patterns usable in a method according to a second embodiment of the present invention.

In the Figures, corresponding reference symbols indicate corresponding parts.

DETAILED DESCRIPTION

Figure 1:
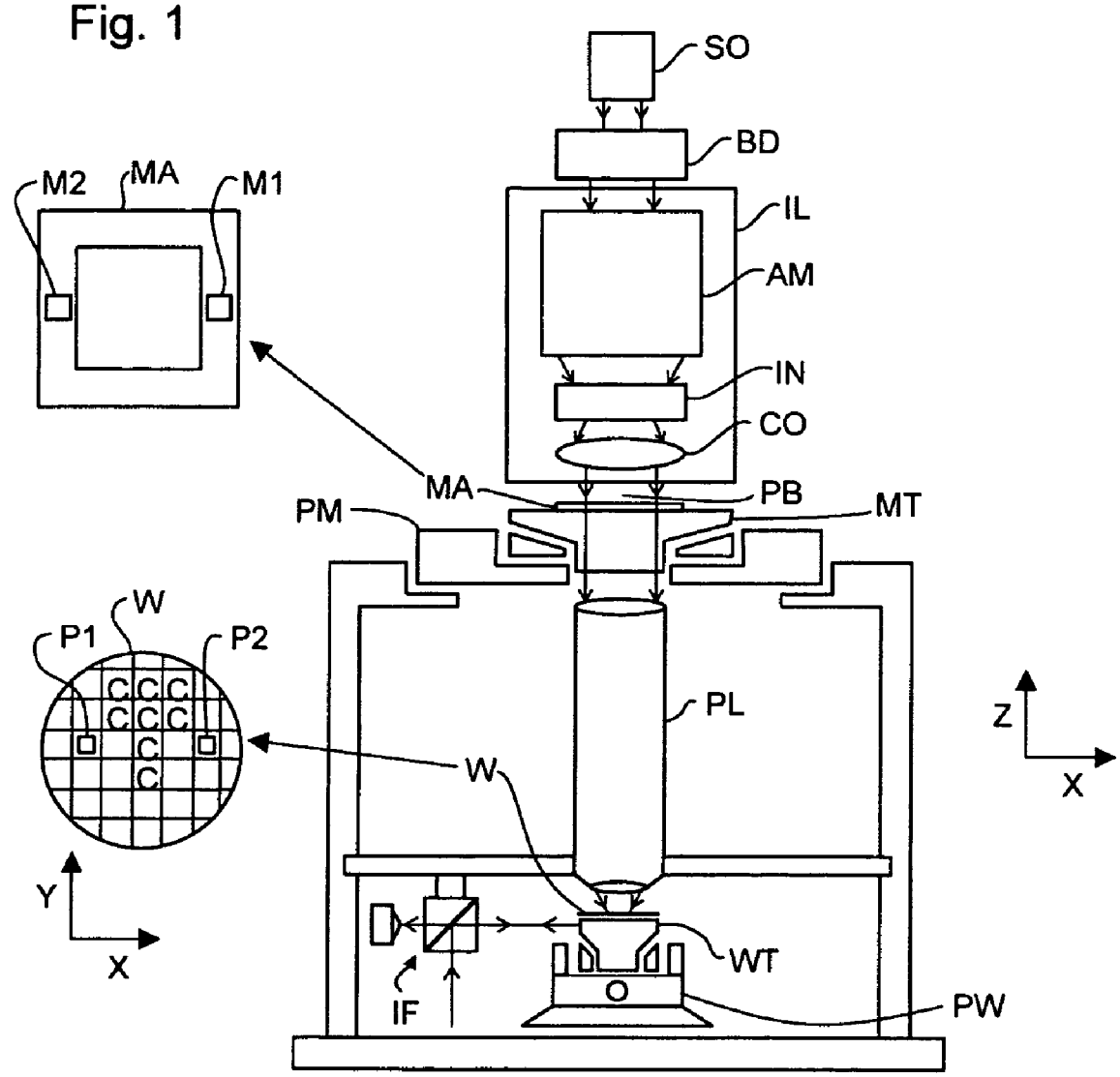
FIG. 1 depicts a lithographic projection apparatus that may be used in the performance of methods according to embodiments of the invention.

Embodiments of the invention include methods of inspection useable in the manufacture of devices by lithographic techniques and methods of manufacturing devices using lithographic techniques. For example, embodiments of the invention include an in-line method of making measurements during manufacture of devices using lithographic techniques that has improved accuracy, sensitivity and/or repeatability.

The term "patterning structure" as here employed should be broadly interpreted as referring to any structure or field that may be used to endow an incoming radiation beam with a patterned cross-section, corresponding to a pattern that is to be created in a target portion of a substrate; the term "light valve" can also be used in this context. Generally, such a pattern will correspond to a particular functional layer in a device being created in the target portion, such as an integrated circuit or other device (see below). It should be noted that the pattern imparted to the projection beam may not exactly correspond to the desired pattern in the target portion of the substrate. Examples of such patterning structure include:

A mask (or "reticle"). The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of very small (possibly microscopic) mirrors, each of which can be individually tilted about an axis by applying a suitable localized electric field, or by employing piezoelectric actuation structure. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic structure. In both of the situations described hereabove, the patterning structure can comprise one or more programmable mirror arrays. More information on mirror arrays as here referred to can be gleaned, for example, from U.S. Pat. No. 5,296,891 and No.

5,523,193 and PCT patent applications WO 98/38597 and WO 98/33096, which documents are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask (or reticle) and mask table; however, the general principles discussed in such instances should be seen in the broader context of the patterning structure as hereabove set forth.

The term "projection system" should be broadly interpreted as encompassing various types of projection system, including refractive optics, reflective optics, and catadioptric systems, for example. For the sake of simplicity, the projection system may hereinafter be referred to as the "lens". The radiation system may also include components operating according to any of these design types for directing, shaping, reducing, enlarging, patterning, and/or otherwise controlling the projection beam of radiation, and such components may also be referred to below, collectively or singularly, as a "lens". Selection of an appropriate projection system may be determined by factors such as the exposure radiation being used, or by other factors such as the use of an immersion fluid or the use of a vacuum.

The illumination system may also encompass various types of optical components, including refractive, reflective, and catadioptric optical components for directing, shaping, or controlling the projection beam of radiation, and such components may also be referred to below, collectively or singularly, as a "lens".

Further, the lithographic apparatus may be of a type having two (dual stage) or more substrate tables (and/or two or more mask tables). In such "multiple stage" devices the additional tables may be used in parallel, or preparatory procedures may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

The lithographic apparatus may also be of a type wherein the substrate is immersed in a liquid having a relatively high refractive index (e.g. water) so as to fill a space between the final element of the projection system and the substrate. Immersion liquids may also be applied to other spaces in the lithographic apparatus, for example, between the mask and the first element of the projection system. The use of immersion techniques to increase the numerical aperture of projection systems is known in the art.

FIG. 1 schematically depicts a lithographic apparatus in conjunction with which an embodiment of the invention may be employed. The apparatus comprises:

an illumination system (illuminator) IL for providing a projection beam PB of radiation (e.g. UV radiation or DUV radiation).

a first support structure (e.g. a mask table) MT for supporting patterning structure (e.g. a mask or reticle) MA and connected to first positioning structure PM for accurately positioning the patterning structure with respect to item PL;

a substrate table (e.g. a wafer table) WT for holding a substrate (e.g. a resist-coated wafer) W and connected to second positioning structure PW for accurately positioning the substrate with respect to item PL. In this example, table WT is connected to (e.g. interferometric) measurement structure IF, which is configured to accurately indicate a position of the substrate with respect to item PL; and a projection system (e.g. a refractive lens group, a catadioptric or catoptric system, and/or a mirror system) PL for imaging a pattern imparted to the projection beam PB by patterning structure MA onto a target portion C (e.g. comprising one or more dies and/or portion(s) thereof) of the substrate W.

As here depicted, the apparatus is of a transmissive type (e.g. employing a transmissive mask). Alternatively, the apparatus may be of a reflective type (e.g. employing a reflective mask and/or programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD (comprising, for example, suitable directing mirrors and/or a beam expander). In other cases the source may be integral part of the apparatus, for example when the source is a mercury lamp. The source SO and the illuminator IL, together with the beam delivery system BD if required, may be referred to as a radiation system. Source SO may also comprise such emitters as an electron gun, a laser-produced or discharge plasma source, or an undulator provided around the path of an electron beam in a storage ring or synchrotron.

The illuminator IL may comprise adjusting structure AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed (alternatively, having been selectively reflected by) the mask MA, the projection beam PB passes through the lens PL, which focuses the beam onto a target portion C of the substrate W. With the aid of the second positioning structure PW and position sensor IF (e.g. an interferometric device), the substrate table WT can be moved accurately, e.g. so as to position different target portions C in the path of the beam PB. Similarly, the first positioning structure PM and another position sensor (which is not explicitly depicted in FIG. 1) can be used to accurately position the mask MA with respect to the path of the beam PB, e.g. after mechanical retrieval from a mask library, or during a scan.

In general, movement of the object tables MT and WT will be realized with the aid of a long-stroke module (coarse positioning) and a short-stroke module (fine positioning), which form part of the positioning structure PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT (and possibly substrate table WT) is kept essentially stationary, while an entire pattern imparted to the projection beam is projected onto a target portion C at once (i.e. in a single static exposure or "flash"). The substrate table WT is then shifted in the X and/or Y direction so that a different target portion C can be exposed. In step mode, the maximum size of the exposure field may limit the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field may limit the width (in the non-scanning direction) of the target portion in a single dynamic exposure, whereas the length of the scanning motion may determine the height (in the scanning direction) of the target portion.

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above-described modes of use or entirely different modes of use may also be employed.

Figure 2:
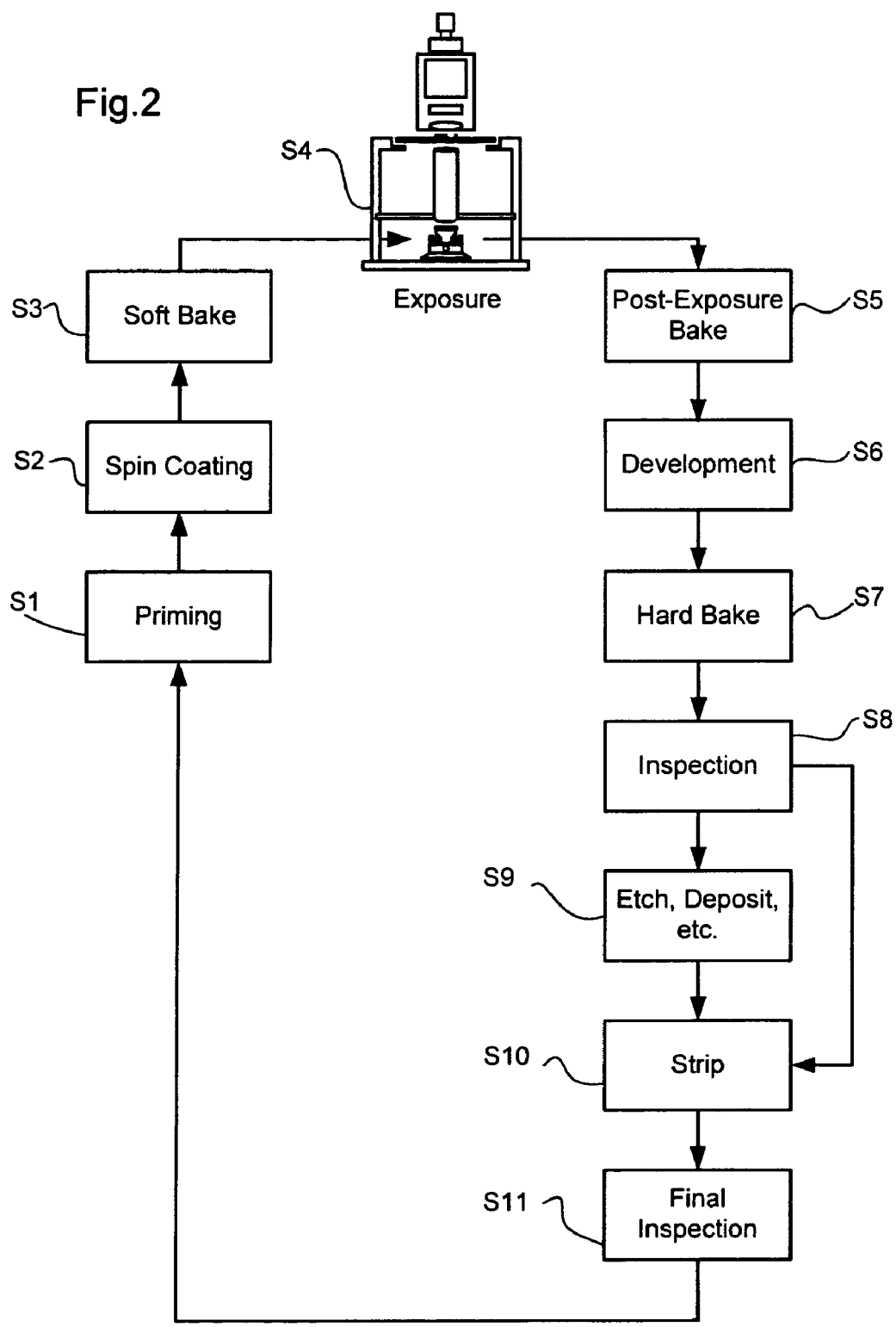
FIG. 2 is a flow diagram of a lithographic process according to an embodiment of the invention.

FIG. 2 is a flow diagram of a lithographic process of which the present invention may form a part. Prior to the exposure procedure S4, which may be carried out using a lithographic apparatus such as described above with relation to FIG. 1, a substrate (e.g. a silicon wafer) may undergo a priming procedure S1, a spin coating procedure S2 (e.g. to coat it with a layer of resist), and/or a soft bake S3 (e.g. to remove solvents from the resist). After exposure, the wafer may undergo a postexposure bake S5, a development procedure S6 during which the exposed or unexposed resist (depending on whether the resist is positive or negative) is removed, and/or a hard bake S7, prior to an inspection procedure S8.

The inspection procedure S8 may include various different measurements and inspections, such as a scatterometry procedure according to an embodiment of the invention and described further below. If the wafer passes inspection, a process procedure S9 may be carried out. Such a procedure may involve etching the areas of the substrate not covered by resist, deposition of a product layer, metallization, ion implantation, etc. After the process procedure S9, the remaining resist may be stripped S10 and a final inspection S11 carried out before the process resumes for another layer. In case a substrate fails an inspection at S8, it may be directed directly to a stripping procedure S10 and another attempt to print the same process layer made.

Figure 3:
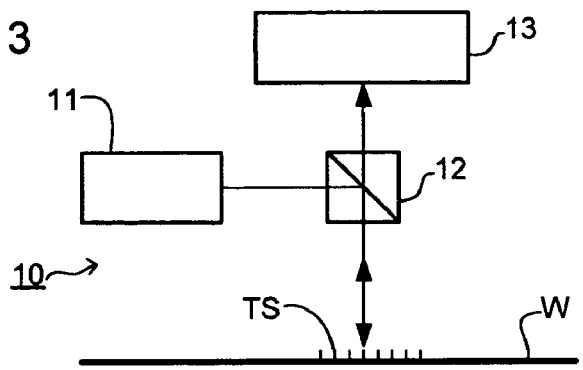
FIG. 3 depicts a scatterometer useable in methods according to embodiments of the present invention.
Figure 4:
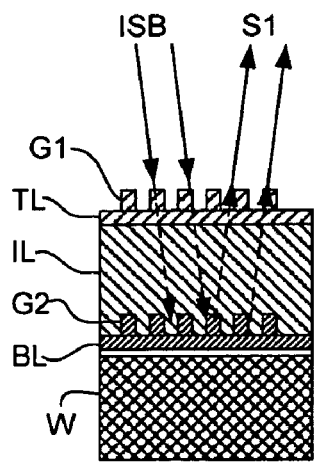
FIGS. 4 to 6 depict a test pattern and first and second reference patterns usable in a method according to a first embodiment of the present invention.
Figure 5:
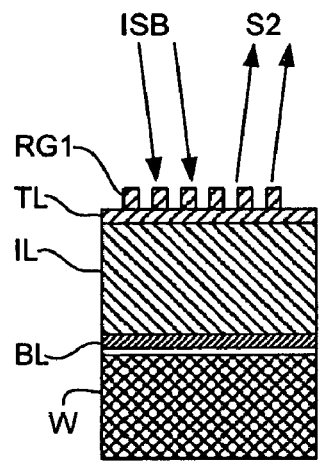
Figure 6:
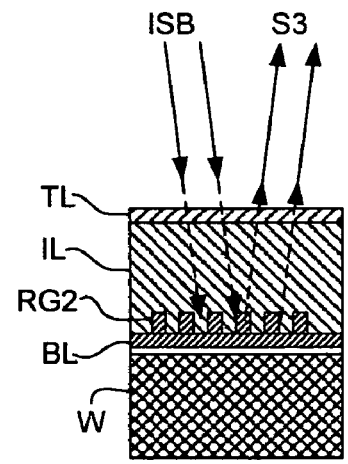

In the inspection procedure S8, a scatterometer such as depicted in FIG. 3 may be used. Other inspections and/or measurements may also be made using other tools. The scatterometer 10 comprises a broadband (e.g. white light) radiation source 11 which directs radiation (e.g. via a beamsplitter 12) onto a test structure TS on the wafer W. The reflected radiation is passed to a spectrometer 13 which measures a spectrum (intensity as a function of wavelength) of the specular reflected radiation. From this data, the structure giving rise to the detected spectrum may be reconstructed, e.g. by Rigorous Coupled Wave Analysis and non-linear regression or by comparison with a library of simulated spectra. In general, for the reconstruction the general form of the structure is known and some parameters are assumed from knowledge of the process by which the structure was made, leaving only a few parameters of the structure to be determined from the scatterometry data.

As illustrated, the scatterometer is a normal-incidence scatterometer. However, the same principle may be applied using inclined incidence scatterometry. Variants of scatterometry in which the reflection at a range of angles of a single wavelength is measured, rather than the reflection at a single angle of a range of wavelengths, may also be used. It may be desired to carry out the scatterometry procedure(s) using normal incidence, white light scatterometry.

In a method according to a first embodiment of the invention, which may be used to measure overlay, the test structure formed (e.g. printed) on the substrate W comprises a first mark (or first pattern component) G1 printed in an upper process layer TL and a second mark (or second pattern component) G2 printed in a lower process layer BL. The marks G1 and G2 may take any desired or convenient form, such as gratings, checkerboards, boxes, frames, chevrons, etc. The form of the marks may be chosen for ease of reconstruction. For example, the use of gratings in particular may allow rapid reconstruction techniques to be used. The mark type can also be chosen to improve sensitivity.

If printed perfectly and unaffected by subsequent processes, the two marks G1 and G2 should be identical. In the absence of overlay error, marks G1 and G2 should also be exactly aligned. Though identical in form, the first and second marks (or pattern components) may differ in their location in the process layers on the substrate. When the test pattern comprising marks G1, G2 is illuminated with normally incident polarized light, the reflected TE, TM, or phase signal contains information about the relative position of the two gratings. However, due to internal reflections in the intervening process layers IL between the upper and lower layers TL, BL containing the gratings G1, G2 and interference, the amplitude of the total reflected signal containing overlay information is very weak and has a low signal-to-noise ratio. Further noise may be introduced by distortions in the marks G1, G2 during printing and, in the case of the lower mark G2, by processes that may have been carried out since it was printed.

In a method according to an embodiment of the present invention, two reference marks RG1, RG2 are printed at the same time as the two parts G1, G2 of the test pattern. Reference pattern RG1 is provided in the top layer TL and corresponds to the first mark G1. Reference pattern RG2 is provided in the bottom layer BL and corresponds to the second alignment mark G2. The reference patterns RG1, RG2 are printed close to, but spaced apart from, each other and the test pattern comprising alignment marks G1, G2. For example, the reference marks RG1, RG2 and the test pattern should be close enough together that they will be affected in the same way by any distortions arising in the printing process or caused by subsequent process procedures. At the same time, these marks or patterns should be sufficiently far apart that separate scatterometry measurements may be taken, without crosstalk. Such a method may be applied to improve measurement of overlay.

Figure 7:
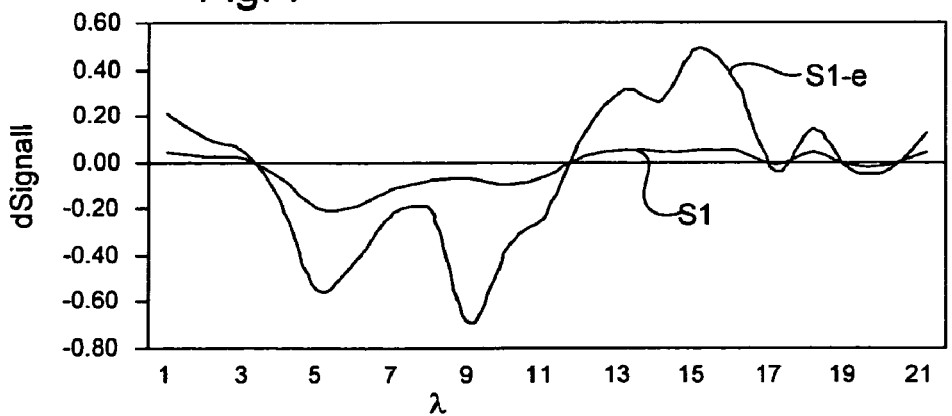
FIG. 7 depicts a raw overlay signal and an overlay signal enhanced according to a method according to the first embodiment of the present invention.

When illuminated in the same way as the test pattern, the reference patterns RG1, RG2 produce scatterometry signals S2, S3 which contain information only about the respective gratings. These signals S2, S3 can then be applied to the scatterometry signal S1 (i.e. used to normalize signal S1) to provide an enhanced scatterometry signal S1-e. FIG. 7 shows an example in which the enhanced signal S1-e has a much higher amplitude but retains the same phase position fingerprint of the original signal. The signal-to-noise ratio is effectively improved.

The enhanced overlay signal may be derived from three specular spectroscopic signals. The first is the "raw" overlay signal generated by the two overlying gratings. The second and third are the signals generated by the bottom and top reference gratings. The enhanced overlay signal may then be derived by dividing the raw overlay signal by the signal from the top reference grating minus the signal from the bottom reference grating.

In one method according to an embodiment of the invention as described above, the first pattern component comprises a first alignment marker printed in a first process layer, and the second pattern component comprises a second alignment marker printed in a second process layer overlying the first pattern component. The reference patterns comprise corresponding reference alignment markers printed in the first and second process layers, respectively, but not overlaid.

A scatterometry signal from the test pattern may be affected by distortions of the alignment markers (e.g. due to the process procedures used to form them and carried out in between) and by the process layers between the layers carrying the alignment markers, as well as by the overlay error which it is desired to measure. The reference patterns enable these effects to be separated from the effect of overlay. Such a method may be used to enable an accurate and sensitive measurement of overlay, e.g. by applying the scatterometry signals from the reference alignment marks to enhance the scatterometry signal from the test pattern prior to processing to determine the overlay error.

A grating structure usable in a method according to a second embodiment of the present invention is depicted in FIGS. 8 to 10. Such a method may be used to measure differential dimensional asymmetry due to comatic aberration in the lithographic apparatus, particularly the projection system PL, or in the process applied to the substrate.

As shown in FIG. 8, the test pattern G comprises a two-bar grating having an inner pitch Pi and an outer pitch Po. The first pattern component comprises a single-bar grating of pitch equal to the inner pitch, and the second pattern component comprises a single-bar grating of pitch equal to the outer pitch. The two reference gratings RG1', RG2' are shown in FIGS. 9 and 10 and comprise respectively a simple grating of pitch Pi and a simple grating of pitch Po.

As in a method according to the first embodiment, the test pattern G and reference patterns RG1', RG2' are illuminated identically with specular polarized light. The resulting reflectance spectra S1', S2', S3' contain information about any differential dimensional asymmetries as well as the actual forms of the gratings. The information about any differential dimensional asymmetry is contained in the reflectance spectra S1' from the dual pitch grating, whilst the spectra S2', S3' contain information about the gratings themselves. As in a method according to the first embodiment, the reflectance spectra S2', S3' may be used to enhance the reflectance spectra S1' to provide a signal containing information of the dimensional asymmetry with an improved signal-to-noise ratio.

In a method according to the second embodiment of the invention, the first and second pattern components may comprise single bar gratings having different pitches which are combined into a test pattern comprising a two-bar grating pattern having an inner pitch and an outer pitch. Specifically, the first and second reference patterns may comprise, respectively, a single bar grating having a pitch equal to the inner pitch and a single bar grating having a pitch equal to the outer pitch. In one application, scatterometry signals from the reference gratings may be used to provide information as to the form of the two components of the two-bar grating and enable asymmetry information that is indicative of coma to be isolated from the scatterometry response of the test pattern.

Whilst specific embodiments of the invention have been described above, it will be appreciated that the invention as claimed may be practiced otherwise than as described. It is explicitly noted that the description of these embodiments is not intended to limit the invention as claimed.

It may be desirable to carry out the scatterometry procedure on the pattern in developed resist, although if there is sufficient contrast in the latent resist image, the scatterometry procedure may be carried out before development. Because the aberration may be detected before a process procedure is carried out, if the aberration is severe enough to result in a defective device, the resist can be stripped and the substrate put back into the process for re-imaging.

In a device manufacturing method according to an embodiment of the invention, it may be desirable to print the test pattern in an area adjacent the pattern of the production layer, such as a scribe lane. In this way, no unnecessary space is taken up on the substrate and a maximum area remains for production of devices.

In a device manufacturing method, information indicative of a parameter may be used to adjust a parameter of the lithographic apparatus or process, after which a further substrate may be provided and acts of providing a projection beam, using patterning structure, and projecting the patterned beam may be repeated. In this way, the results of scatterometry measurements taken on one substrate can be used to adjust the lithographic apparatus or process so that subsequent exposures are improved.

A method according to an embodiment of the invention as set forth herein may be used to make a rapid, accurate and repeatable measurement of a parameter of the test pattern as printed on the substrate. The test and reference patterns can be printed in the course of production exposures (for example, in a scribe lane or edge die or other unused area of the substrate) without requiring significant additional time. The reflection spectra can be measured by the scatterometer equally quickly and without delaying the production line. Such a measurement method can therefore be used in-line, as a qualification or calibration tool.

As compared to a scatterometry technique that uses a single test pattern, addition of reference patterns as disclosed herein may improve the sensitivity and/or simplify the process of deriving the desired information from the scatterometry data. In some cases, reconstruction of the reference patterns is simpler than reconstruction of the two-component test pattern and is performed first. The results of the reconstruction of the reference pattern may then be used to simplify reconstruction of the test pattern. In other cases, the desired information can be obtained directly from comparison of the different spectra, without any need to reconstruct the test pattern.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "reticle," "wafer," or "die" herein may be considered as synonymous with the more general terms "mask," "substrate," or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

What is claimed is:

1. An inspection method comprising:
   forming, at a surface of a substrate, a test pattern comprising a combination of first and second pattern components, said first pattern component being different from said second pattern component;
   forming, at a surface of the substrate, first and second reference patterns corresponding respectively to said first and second pattern components;
   measuring a reflection spectrum of said test pattern, a reflection spectrum of said first reference pattern, and a reflection spectrum of said second reference pattern; and
   deriving, from said reflection spectra, information indicative of at least one parameter of said test pattern.

2. The inspection method according to claim 1, wherein said forming at least one of the test pattern, the first reference pattern, and the second reference pattern includes printing the pattern on the substrate.

3. The inspection method according to claim 1, wherein said at least one parameter includes overlay error.

4. The inspection method according to claim 1, wherein said at least one parameter includes comatic aberration.

5. The inspection method according to claim 1, wherein said first and second pattern components differ in form.

6. The inspection method according to claim 5, wherein said at least one parameter includes asymmetry.

7. The inspection method according to claim 5, wherein said test pattern comprises a two-bar grating pattern having an inner pitch and an outer pitch, and
   wherein said first and second reference patterns comprise respectively a single bar grating having a pitch equal to the inner pitch and a single bar grating having a pitch equal to the outer pitch.

8. The inspection method according to claim 1, wherein said forming a test pattern comprises:
   forming said first pattern component in a first process layer provided on the substrate; and
   forming said second pattern component in a second process layer provided on the substrate and different from the first process layer.

9. The inspection method according to claim 8, wherein said first and second pattern components are substantially identical in form.

10. The inspection method according to claim 1, wherein said deriving comprises:
    constructing representations of said first and second reference patterns, based on said reflection spectra of said first and second reference patterns; and
    constructing a representation of said test pattern, based on said representations of said first and second reference patterns.

11. The inspection method according to claim 1, wherein said deriving includes obtaining said information directly from said reflection spectra without constructing a representation of the test pattern.

12. The inspection method according to claim 1, wherein said deriving includes applying the reflection spectrum of at least one of the first and second test patterns to increase a signal strength of the reflection spectrum of the test pattern.

13. The inspection method according to claim 1, wherein said measuring includes using a scatterometer.

14. The inspection method according to claim 1, wherein said measuring includes using a normal incidence scatterometer.

15. An inspection method comprising:
    forming, at a surface of a substrate, a test pattern comprising a combination of first and second pattern components, said first pattern component being different from said second pattern component;
    forming, at a surface of the substrate, first and second reference patterns corresponding respectively to said first and second pattern components;
    measuring a reflection spectrum of said test pattern, a reflection spectrum of said first reference pattern, and a reflection spectrum of said second reference pattern; and
    deriving, from said reflection spectra, information indicative of at least one parameter of said test pattern,
    wherein said forming a test pattern comprises:
       forming said first pattern component in a first process layer provided on the substrate; and
       forming said second pattern component in a second process layer provided on the substrate and different from the first process layer,
    wherein said test pattern comprises first and second alignment markers printed one above the other, one in the first process layer and the other in the second process layer, and
    wherein said first and second reference patterns comprise corresponding reference alignment markers printed in the corresponding process layers, respectively, but not overlaid.

16. A device manufacturing method comprising:
    providing a substrate that is at least partially covered by a layer of radiation-sensitive material;
    providing a projection beam of radiation using a radiation system;
    using patterning structure to endow the projection beam with a pattern in its cross-section;
    projecting the patterned beam of radiation onto a target portion of the layer of radiation-sensitive material to form at a surface of the substrate (1) a test pattern comprising a combination of first and second pattern components, said first pattern component being different from said second pattern component, and (2) first and second reference patterns corresponding respectively to said first and second pattern components;

measuring a reflection spectrum of said test pattern, a reflection spectrum of said first reference pattern, and a reflection spectrum of said second reference pattern; and deriving, from said reflection spectra, information indicative of at least one parameter of said test pattern.

17. The device manufacturing method according to claim 16, wherein the patterned beam of radiation includes a representation of a process layer, and wherein the test pattern is formed in an area adjacent to an area irradiated by the representation of the process layer.

18. The device manufacturing method according to claim 17, wherein the test pattern is printed in a scribe lane.

19. The device manufacturing method according to claim 16, said method further comprising:

adjusting at least one of a parameter of the lithographic apparatus or a production process according to said information;

subsequent to said adjusting, providing a second substrate and performing acts of providing a projection beam of radiation using a radiation system, using patterning structure to endow the projection beam with a pattern in its cross-section, and projecting the patterned beam onto a target portion of a layer of radiation-sensitive material on the second substrate.

* * * * *